United States Patent
Nam et al.

[11] Patent Number: 5,960,281
[45] Date of Patent: Sep. 28, 1999

[54] METHODS OF FABRICATING MICROELECTRONIC ELECTRODE STRUCTURES USING HEMISPHERICAL GRAINED (HSG) SILICON

[75] Inventors: Seung-hee Nam, Seoul; Young-sun Kim; Young-wook Park, both of Kyungki-do, all of Rep. of Korea

[73] Assignee: Samsung Electronics Co., Ltd., Rep. of Korea

[21] Appl. No.: 08/861,607

[22] Filed: May 22, 1997

[30] Foreign Application Priority Data

May 23, 1996 [KR] Rep. of Korea .................... 96-17740

[51] Int. Cl.⁶ .................................... H01L 21/8242
[52] U.S. Cl. ....................... 438/255; 438/398; 438/964
[58] Field of Search ............................. 438/253–256, 438/390–398, 964

[56] References Cited

U.S. PATENT DOCUMENTS

| | | | |
|---|---|---|---|
| 5,234,862 | 8/1993 | Aketagawa et al. | 437/103 |
| 5,366,917 | 11/1994 | Watanabe et al. | 437/47 |
| 5,372,962 | 12/1994 | Hirota et al. | 437/47 |
| 5,385,863 | 1/1995 | Tatsumi et al. | |
| 5,394,012 | 2/1995 | Kimura | 257/739 |
| 5,405,801 | 4/1995 | Han et al. | 437/60 |
| 5,464,791 | 11/1995 | Hirota | 437/60 |
| 5,486,488 | 1/1996 | Kamiyama | 437/60 |
| 5,543,347 | 8/1996 | Kawano et al. | 437/60 |
| 5,554,557 | 9/1996 | Koh | 437/52 |
| 5,567,637 | 10/1996 | Hirota | 437/43 |
| 5,590,051 | 12/1996 | Yokozawa | 364/496 |
| 5,595,937 | 1/1997 | Mikagi | 437/192 |
| 5,616,511 | 4/1997 | Hirota | 438/396 |
| 5,623,243 | 4/1997 | Watanabe et al. | 257/309 |

FOREIGN PATENT DOCUMENTS

| | | | |
|---|---|---|---|
| 0731491A2 | 11/1996 | European Pat. Off. | H01L 21/20 |
| 4-286151 | 10/1992 | Japan . | |

OTHER PUBLICATIONS

H. Watanabe et al., A New Cylindrical Capacitor Using Hemispherical Grained Si (HSG–Si) for 256Mb DRAMs, 1992, IEEE, IEDM 92, Apr. 1992, 10.1.1–10.1.4. pp. 259–262.

Watanabe et al., "A New Cylindrical Capacitor Using Hemispherical Grained Si (HSG–Si) for 256Mb DRAMS", IEDM, 1992, pp. 259–262.

*Primary Examiner*—Jey Tsai
*Attorney, Agent, or Firm*—Myers Bigel Sibley & Sajovec

[57] ABSTRACT

An electrode structure is fabricated on a microelectronic substrate by forming an amorphous silicon electrode on the microelectronic substrate and cleaning the surface of the amorphous silicon electrode to remove contaminants and surface oxides therefrom. A thin amorphous silicon layer is formed on the clean surface of the amorphous silicon electrode. Silicon crystal nuclei are then formed and grown on the thin amorphous silicon layer. The electrode structure may be used as a bottom electrode for an integrated circuit capacitor, such as the storage capacitor for an integrated circuit DRAM.

28 Claims, 10 Drawing Sheets

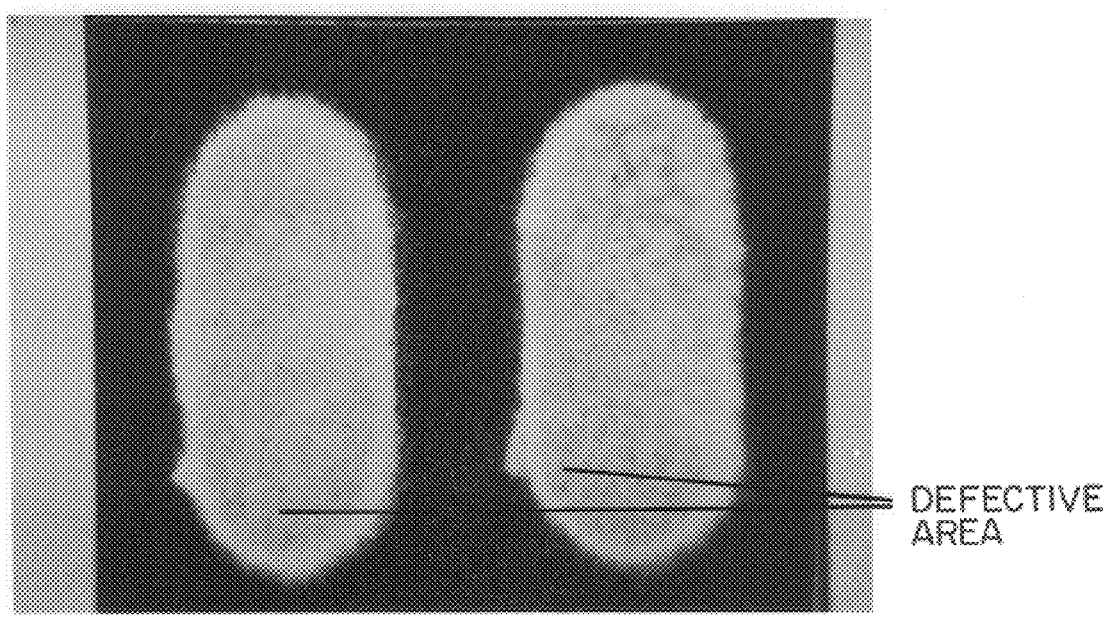
FIG. IA.
(PRIOR ART)
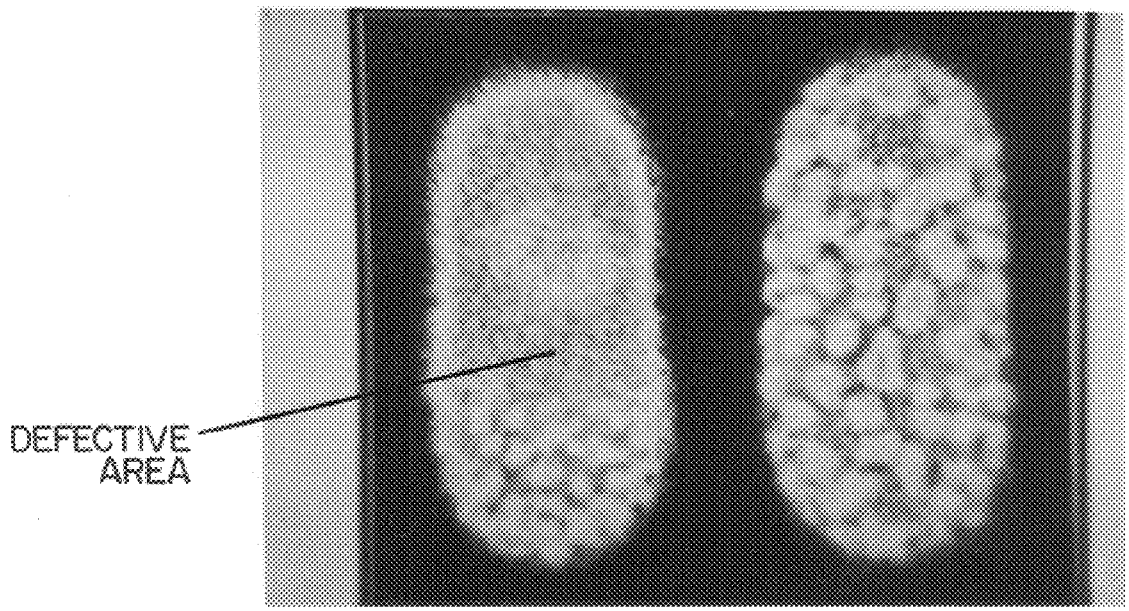
FIG. IB.

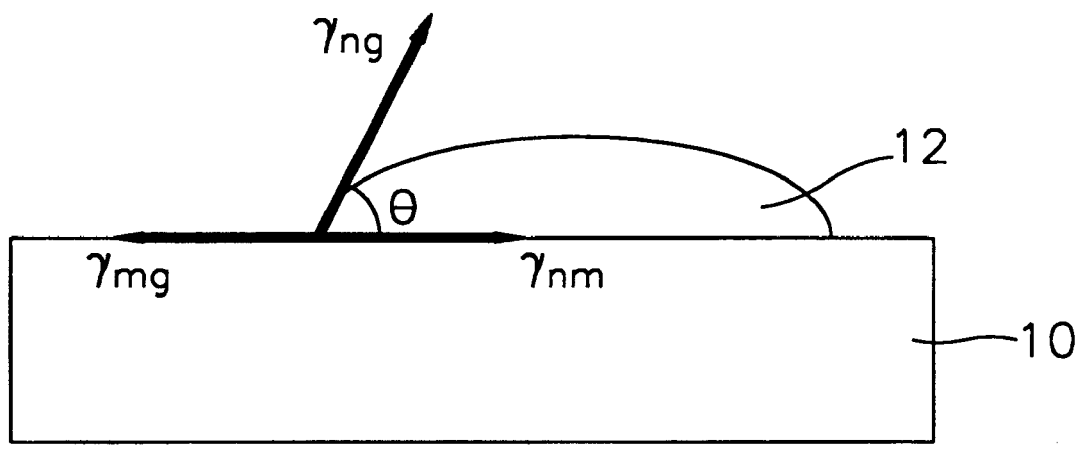

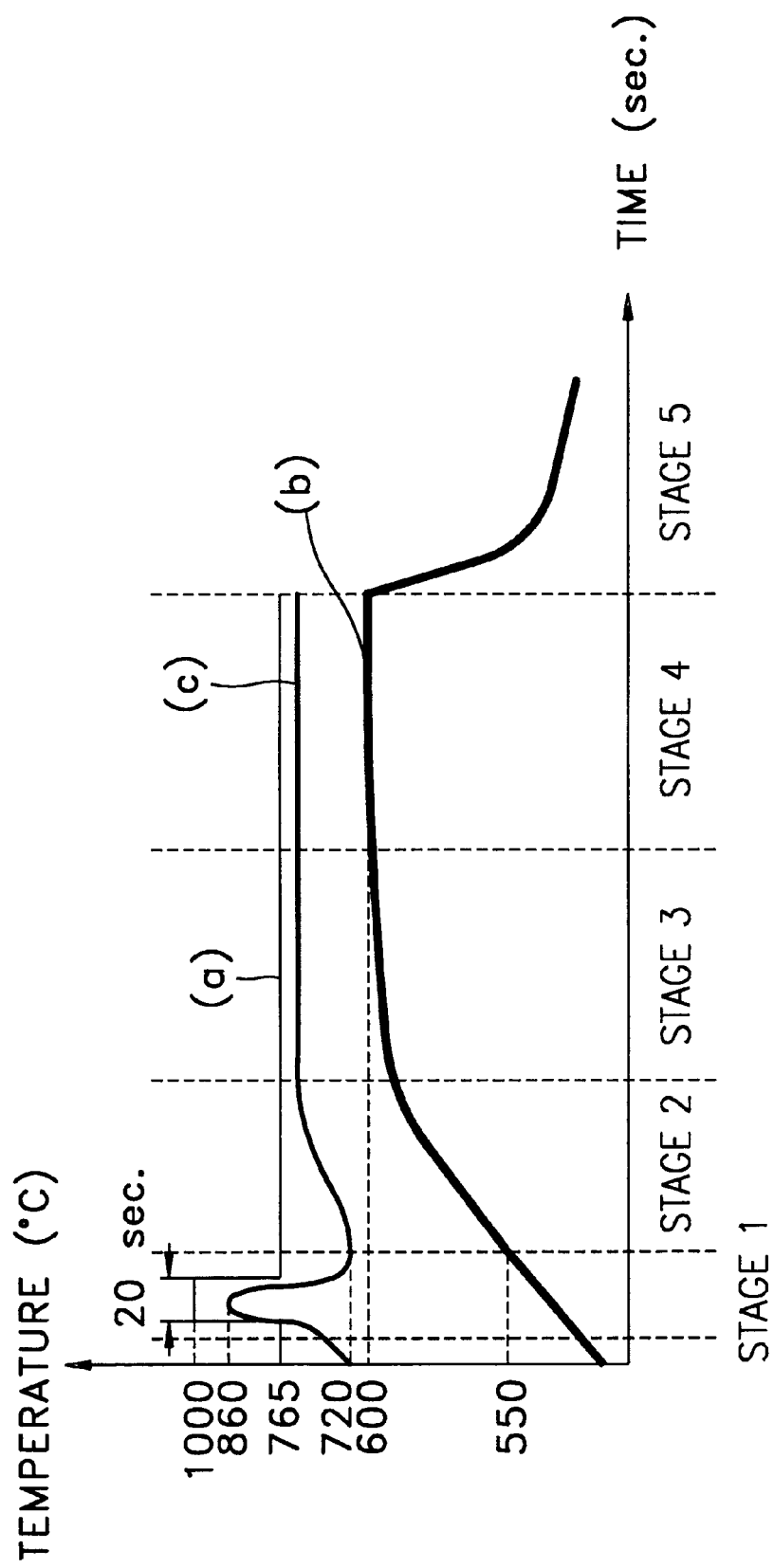

FIG. 12

METHODS OF FABRICATING MICROELECTRONIC ELECTRODE STRUCTURES USING HEMISPHERICAL GRAINED (HSG) SILICON

FIELD OF THE INVENTION

This invention relates to methods of fabricating microelectronic devices, and more particularly to methods of fabricating capacitors and electrodes for microelectronic devices.

BACKGROUND OF THE INVENTION

Microelectronic capacitors are widely used in microelectronic devices. For example, microelectronic capacitors are widely used to store information in a Dynamic Random Access Memory (DRAM).

As the integration density of DRAMs continues to increase, the surface area of a memory cell tends to decrease. This may cause a decrease the capacitance of the cell capacitor, which may result in a lower performance and increased soft error rate. Therefore, it is generally desirable to maintain a large cell capacitance, notwithstanding the decreasing size of the DRAM cell.

Many techniques have been used to increase the capacitance in a given unit area. In particular, as is well known, capacitance C of a capacitor is given by:

$$C = \frac{\varepsilon_0 \cdot \varepsilon_r \cdot A}{d}$$

where $\varepsilon_0$ is the dielectric constant of free space, $\varepsilon_r$ is the relative dielectric constant of a dielectric film, A is the effective area of an electrode, and d is the thickness of the dielectric film. Accordingly, from the above equation, the capacitance can be increased by varying one or more of three parameters: the dielectric constant of the dielectric film, the effective area of the capacitor and/or the thickness of the dielectric film.

It has been proposed to increase the effective area of the capacitor by increasing the effective area of a capacitor electrode. In particular, a capacitor electrode with ridges and valleys may be formed to thereby increase the surface area of the electrode. It has been proposed to use Hemispherical Grain (HSG) silicon film having a rugged surface. This may be used in combination with a three dimensional capacitor structure such as a stack, a trench and/or a cylindrical structure to increase the effective area of the electrode per unit area of the microelectronic substrate.

U.S. Pat. No. 5,385,863 to Tatsumi discloses a technique for increasing the effective area of the capacitor electrode using an HSG silicon film. In particular, a capacitor electrode of polysilicon film is formed. The polysilicon film is formed by depositing an amorphous silicon film on an insulating film covering a substrate, generating a plurality of crystal nuclei on the amorphous silicon film and growing the crystal nuclei into mushroom or hemisphere-shaped crystal grains, thereby converting the amorphous silicon film into the polysilicon film.

Unfortunately, it may be difficult to maintain the amorphous film in a clean condition. Contamination of the surface by foreign materials or crystallization of an area of the amorphous silicon film may suppress the surface migration of the silicon atoms in the amorphous silicon film, and may thus reduce or prevent crystal nucleation and growth. Accordingly, poor quality HSG films may be produced.

FIGS. 1A and 1B are scanning electron microscope (SEM) photos showing the result of forming HSG films on a partially crystallized amorphous silicon film on a semiconductor substrate. As noted from the figures, HSGs are normally formed on amorphous silicon, while no growth of nuclei is observed in a crystallized portion due to the absence of activation energy of silicon.

Similarly, when the amorphous silicon surface is contaminated by foreign materials and thus the amorphous silicon atoms are combined with foreign atoms, it may be difficult for the silicon to migrate. The amorphous silicon surface thus may be further contaminated, and crystal nucleation and growth may end if the foreign materials are accumulated to a predetermined thickness.

A publication by H. Watanabe et al. entitled "*A New Cylindrical Capacitor Using Hemispherical Grained Si (HSG—Si)* for *256MB DRAMs*", *IEDM*, 1992, pp. 259–262, describes the fabrication of a cylindrical electrode structure of a p-doped amorphous silicon film. A native oxide on the electrode surface is removed by a diluted HF solution. HSG—Si is then formed on the amorphous silicon surface using seeding method, $Si_2H_6$ molecule irradiation and annealing at 580° C. in an ultra-high vacuum chamber.

SUMMARY OF THE INVENTION

It is therefore an object of the present invention to provide methods of fabricating microelectronic electrode structures including Hemispherical Grain (HSG) silicon.

It is another object of the present invention to provide methods of forming microelectronic electrode structures using HSG silicon which can have uniform HSG grains.

These and other objects are provided according to the present invention by methods of fabricating an electrode structure on a microelectronic substrate wherein an amorphous silicon electrode is formed and cleaned to remove contaminants and surface oxides, and then a thin amorphous silicon layer is formed on the clean surface of the amorphous silicon electrode. A plurality of silicon crystal nuclei are then formed and grown on the thin amorphous silicon layer.

In particular, according to methods of the present invention, an electrode structure is fabricated on a microelectronic substrate by forming an amorphous silicon electrode on the microelectronic substrate. The surface of the amorphous silicon electrode is cleaned to remove contaminants and surface oxides therefrom. A thin amorphous silicon layer is formed on the cleaned surface of the amorphous silicon electrode. A plurality of silicon crystal nuclei are formed and grown on the thin amorphous silicon layer.

The thin amorphous silicon layer is preferably formed by loading the microelectronic substrate, including the cleaned surface of the amorphous silicon electrode, into a process chamber which is maintained under a high vacuum. A predetermined gas is then supplied into the process chamber for a predetermined time. More particularly, the microelectronic substrate is mounted on a susceptor in the process chamber and the susceptor is heated during the supplying step. For example, the susceptor is maintained at temperatures between 700–1000° C. for 5– 40 seconds, and immediately thereafter the susceptor is maintained at temperatures between 500–800° C. Alternatively, the susceptor may be maintained at constant temperature.

The cleaning step may be accomplished by wet cleaning the surface of the amorphous silicon electrode. The predetermined gas may be at least one of $SiH_4$, $Si_2H_6$ and $SiH_2Cl_2$.

In a preferred embodiment of the present invention, the step of forming a thin amorphous silicon layer on the clean surface of the amorphous silicon electrode and the step of forming and growing a plurality of silicon crystal nuclei in the thin amorphous layer are performed without breaking vacuum therebetween. The silicon crystal nuclei may be formed by supplying a predetermined gas to form a plurality of silicon crystal nuclei and then terminating the supplying of the predetermined gas to grow the plurality of silicon crystal nuclei.

In other aspects of the present invention, after the step of forming and growing the silicon crystal nuclei, a dielectric layer is formed on the grown silicon crystal nuclei and a second electrode is formed on the dielectric layer, opposite the growing silicon crystal nuclei. A capacitor for a microelectronic substrate is thereby fabricated.

Moreover, methods of the present invention may be used to fabricate a Dynamic Random Access Memory (DRAM). In particular, prior to forming the amorphous silicon electrode, a memory cell transistor is formed in the microelectronic substrate. The transistor includes a source/drain at a face of the microelectronic substrate. An insulating layer is formed on the microelectronic substrate. The insulating layer includes a contact hole with exposes the source/drain. Then, the amorphous silicon electrode is formed on the insulating layer and electrically contacts the source/drain through the contact hole. Accordingly, high quality electrode structures, microelectronic capacitors and DRAM devices may be fabricated.

BRIEF DESCRIPTION OF THE DRAWINGS

FIGS. 1A and 1B are SEM photos showing the result of forming HSG films on a partially crystallized amorphous silicon film on a microelectronic substrate;

FIG. 2 illustrates surface tensions of a crystal nucleus formed on the surface of a lower electrode;

FIG. 7 graphically illustrates variations of a process temperature in a process chamber in fabricating devices according to the present invention;

FIG. 12 is a graph showing the result from an estimate of Cmin/Cmax characteristics of capacitors fabricated according to methods of the present invention.

DETAILED DESCRIPTION OF PREFERRED EMBODIMENTS

Figure 3:
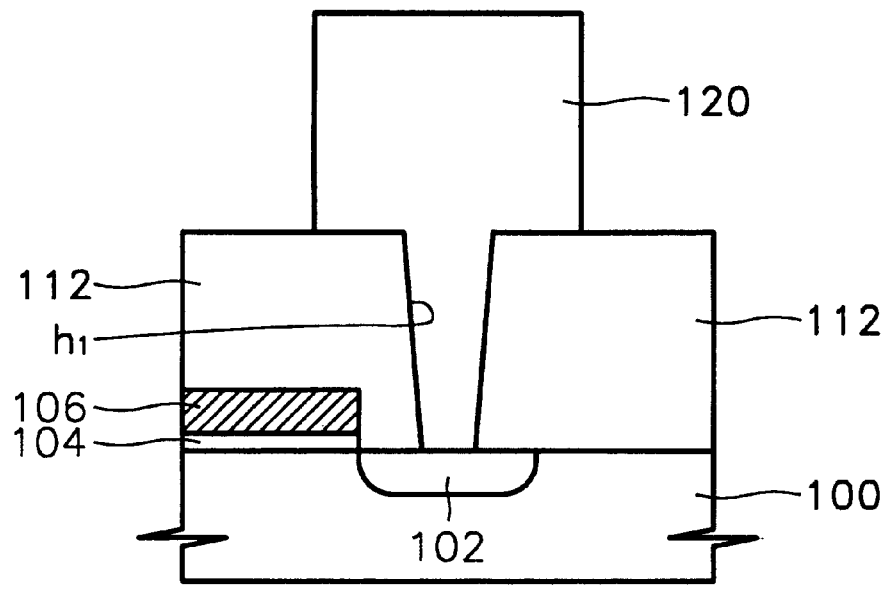
FIGS. 3 through 6 are cross-sectional views sequentially showing steps in methods for fabricating dynamic random access memory devices according to a preferred embodiment of the present invention.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will also be understood that when a layer is referred to as being "on" another layer or substrate, it can be directly on the other layer or substrate, or intervening layers may also be present. Moreover, each embodiment described and illustrated herein includes its complementary conductivity type embodiment as well.

While not wishing to be bound by any theory of operation, the formation of HSG silicon film to increase the effective area of an electrode appears to rely on the mechanism of surface migration of silicon atoms. According to such a mechanism, crystal nuclei are formed on the surface of an amorphous silicon film using a silicon source gas, e.g., silane ($SiH_4$) or disilane ($Si_2H_6$) gas, and annealed so that silicon atoms of the amorphous silicon film migrate to the crystal nuclei and form an HSG silicon film having hemispherical grains of a predetermined size on the surface of the amorphous silicon film. In order to allow the crystal nuclei to continuously grow for a specified period of time, the migration time of the silicon atoms to the crystal nuclei should exceed the crystallization time of a bulk area of an underlying amorphous silicon film. Therefore, the migration time and the crystallization time should be stably controlled to increase of the effective area of the electrode by the above mechanism.

The mechanism of forming the HSG silicon film as a rugged surface on the surface of an amorphous silicon film may be affected by two factors during processing: the characteristics of the amorphous silicon film itself and contamination caused by foreign materials adsorbed on the surface of the underlayer before or after crystal nucleation.

Specifically, the amorphous silicon film used as an underlayer to form the rugged surface should be kept amorphous and completely free of crystal grains. The possible existence of the crystal grains in the underlayer may prevent silicon atoms of the crystal grains from migrating to the crystal nuclei during formation of the rugged surface. On the other hand, foreign material-induced contamination may occur in cleaning the surface of the underlayer or exposing a structure including the crystal nuclei to the atmosphere. Thus, the surface of the underlayer should be kept clean before silicon crystal nucleation.

FIG. 2 illustrates a typical crystal nucleus 12 formed of crystal silicon on the surface of a lower amorphous silicon electrode pattern 10 in a gaseous atmosphere. Generally, the mechanism in which crystal nuclei formed on an amorphous silicon surface grow with phase transition as activation energy can be expressed as the sum of phase transition-related Gibbs free energy and interface energy, i.e., surface energy generated during crystal nucleation and growth. Referring to FIG. 2, such a relationship is given by $$C=(4/3)\pi r^3 \Delta G_{tr} f(\theta) + 4\pi r^2 \gamma f(\theta)$$

where $\Delta G$ is the total Gibbs free energy, r is the radius of a crystal nucleus, and $\Delta G_{tr}$ is the Gibbs free energy of phase transition per unit volume ($\Delta G_{tr} = \Delta G_{crystal} - \Delta G_{amorphous}$). $\gamma$ is the vector sum of $\gamma_{mg}$, $\gamma_{nm}$, and $\gamma_{ng}$, which are the surface tensions between gas and amorphous silicon, between crystal silicon and amorphous silicon, and between gas and crystal silicon, respectively. $f(\theta)$ is a configuration factor.

As described above, the silicon atoms on the surface of the amorphous silicon migrate to the crystal silicon, that is, the crystal nucleus 12, with activation energy given by the above equation so that crystal nuclei are grown. The above equation represents the minimum activation energy for the growth of the silicon atoms in the amorphous silicon film into crystal silicon through the phase-transition to the crystal silicon nucleus. In practice, the silicon atoms of the amorphous silicon film should migrate to the crystal silicon for the growth of the crystal nucleus. To allow the silicon atoms in the amorphous silicon film to migrate to the crystal silicon, the amorphous silicon should be kept in amorphous condition and have a surface in which silicon atoms are not combined with other atoms.

In the present invention, a semiconductor substrate having an amorphous silicon layer formed thereon is loaded in a process chamber and an amorphous silicon thin layer of high purity and few defects is formed on the amorphous silicon layer in an ultrahigh vacuum state. Subsequently, crystal nucleation and growth are performed on the amorphous silicon thin layer, thereby forming an intended rugged surface.

FIGS. 3 through 6 are cross-sectional views sequentially showing steps in methods for manufacturing semiconductor memory devices according to a preferred embodiment of the present invention.

As will be understood by those having skill in the art, a DRAM includes a plurality of memory cells. Each memory cell includes a storage electrode in a memory cell transistor which connects the memory cell capacitor to a bit line in response to an activation signal on a word line. As shown in FIG. 3, a memory cell transistor includes a source/drain region 102 at a face of a microelectronic substrate, such as a semiconductor substrate 100, and a gate including a gate electrode 106 and a gate insulating layer 104 on the face of the semiconductor substrate 100. A second source/drain of the memory cell transistor may be connected to a bit line, and a word line may be connected to the gate electrode 106.

Still referring to FIG. 3, an insulation layer is formed on the semiconductor substrate 100 to insulate the underlying structure. Then, a photoresist pattern (not shown) is formed on the insulation layer by photolithography. The insulation layer is etched using the photoresist pattern as an etching mask, thereby forming an insulation pattern 112 and a contact hole $h_1$ for exposing the source/drain 102.

After the photoresist pattern is removed, an impurity-doped amorphous silicon film is deposited on the insulation pattern 112 including in the contact hole $_1$. A lower (storage) electrode pattern 120 of amorphous silicon is formed by patterning the deposited amorphous silicon film.

Thereafter, contaminants and a surface oxide film, i.e., a natural oxide film are removed from the surface of the lower electrode pattern 120 by wet-cleaning. Subsequently, to form a rugged surface, the substrate including the cleaned electrode surface is loaded in the process chamber (not shown) and kept in a ultrahigh vacuum state, preferably, below or at a pressure of $10^{-7}$ torr.

FIG. 7 is a graph showing temperature variation in each stage during processing in the process chamber to form the rugged surface on the lower electrode pattern 120 of the semiconductor substrate 100. In FIG. 7, reference character (a) indicates variation in a setting temperature of a heater installed in the chamber to control the temperature of a susceptor in the process chamber. Reference character (b) indicates a variations in semiconductor substrate temperature actually observed. Reference character (c) indicates a variation in susceptor temperature.

Referring to FIG. 7, in stage 1, the susceptor is heated to 700–1000° C., preferably about 850° C., by increasing the heater temperature to approximately 1000° C. for about 5–40 seconds, preferably 20 seconds, so as to rapidly increase the temperature of the semiconductor substrate 100 having the lower electrode pattern 120 formed thereon loaded in the process chamber. Then, the susceptor temperature is reduced to a predetermined temperature, for example, 500–800° C., preferably 720° C., by decreasing the heater temperature to about 765° C., and then the heater temperature is maintained at about 765° C.

The semiconductor substrate 100 is kept in the process chamber for a predetermined time until the surface of the lower electrode pattern 120 is set at a temperature appropriate for depositing an amorphous silicon thin layer thereon in a subsequent process. Such a standby time, that is, the time required to reach a temperature suitable for the deposition of the amorphous silicon thin layer, is referred to as a temperature stabilizing time.

In stage 2 of FIG. 7, when the substrate temperature reaches a predetermined temperature lower than a temperature appropriate for the deposition of the amorphous silicon thin layer, that is, a rugged surface forming temperature, preferably 550° C. or below, the process chamber is supplied with a process gas needed to form crystal nuclei for rugged surface formation. For example, one or more of $SiH_4$, $Si_2H_6$, and $SiH_2Cl_2$ is supplied, so as to deposit an amorphous silicon thin layer on the surface of the lower electrode pattern 120. An inert gas such as nitrogen ($N_2$) or argon (Ar) can be simultaneously supplied into the process chamber.

Figure 4:
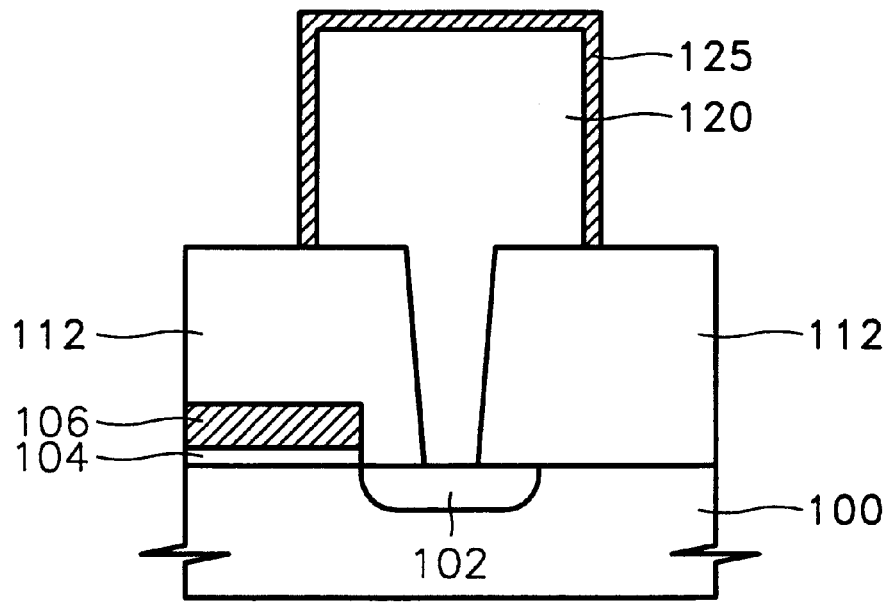

FIG. 4 illustrates the amorphous silicon thin layer 125 deposited on the cleaned surface of the lower electrode pattern 120. The amorphous silicon thin layer 125 is deposited to a thickness of several tens of Ångstroms, preferably only on the surface of the lower electrode pattern 120, by controlling the process gas supply time. Since the process chamber is kept at near vacuum conditions of $10^{-3}$ torr or below during the deposition of the amorphous silicon thin layer 125, the adsorption of impurities on the surface of the lower electrode pattern 120 may be prevented, thus suppressing contamination of the surface of the semiconductor substrate.

While the amorphous silicon thin layer 125 is being deposited in stage 2 of FIG. 7, the substrate temperature is heated to a temperature to allow crystal nuclei formation, for example, 570° C. or above. Thus, a plurality of crystal nuclei 128 can be formed on the surface of the amorphous silicon thin layer 125, as shown in FIG. 5.

Figure 5:
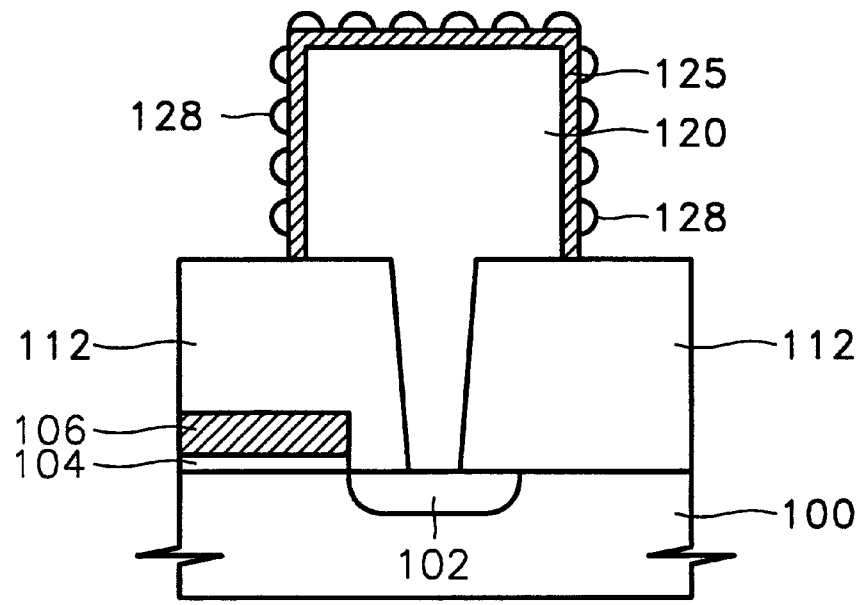

In stage 3 of FIG. 7, as the semiconductor substrate 100 is gradually heated to a crystallization temperature or above, a plurality of crystal nuclei are successively formed on the amorphous silicon thin layer 125 (see FIG. 5). That is, the crystal nuclei are formed on the amorphous silicon thin layer 125 without breaking vacuum, subsequent to the deposition of the amorphous silicon thin layer 125 in high vacuum. During the silicon crystal nucleation, the aforementioned process is continuously provided. When necessary, the flow of gas may be simultaneously controlled. Thus, adsorption and generation of impurities can be prevented by sequential formation of the amorphous silicon thin layer 125 and the silicon crystal nuclei without breaking vacuum. Therefore, crystal nuclei of a uniform configuration can be formed in the method of the present invention.

In stage 4 of FIG. 7, supply of the process gas is terminated, and the pressure of the process chamber is maintained again in ultrahigh vacuum, for example, below or at $10^{-7}$ Torr, and a process for crystal nuclei growth is performed. That is, as the temperature of the semiconductor substrate 100 reaches a steady-state temperature in the process chamber, crystal nuclei 128 are in effect subjected to heat treatment at the silicon crystallization temperature or above. In practice, it takes approximately 150 seconds for the semiconductor substrate 100 to reach a steady state, i.e., about 600° C. in the process chamber. At this time period, silicon atoms in the amorphous silicon thin layer 125 migrate to the crystal nuclei 128 so that crystal nuclei 128 can be grown. If the crystal nuclei continue to grow, mutual cohesion may take place between adjacent crystal grains, resulting in reduction of the effective area of the capacitor. Therefore, the growth of the grains should be controlled by adjusting the heat treatment temperature and time to produce a rugged surface having grains of an appropriate size.

Figure 6:
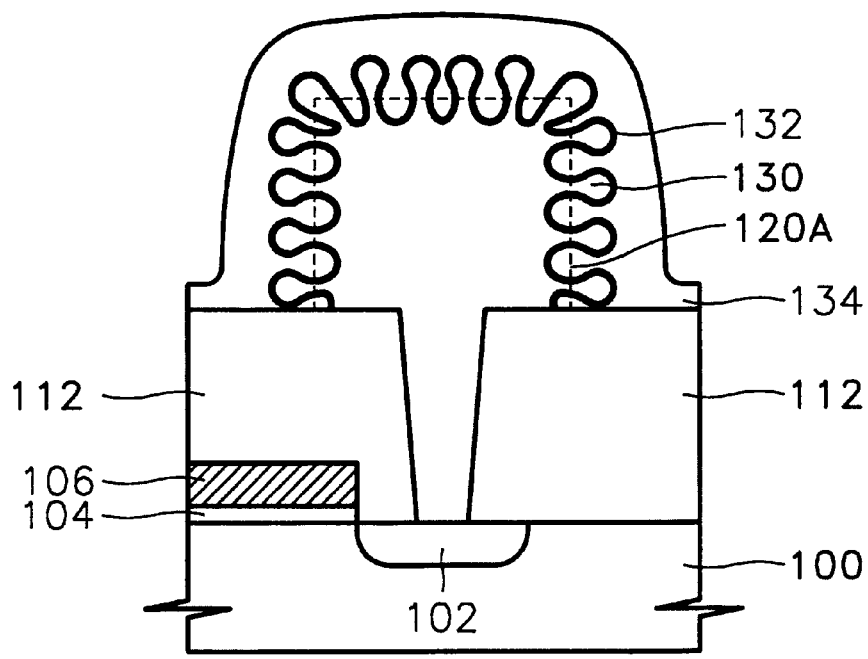

FIG. 6 is a cross-sectional view of a completed lower electrode 130 having a rugged surface. In FIG. 6, reference numeral 120A indicates the outline of the lower electrode pattern 120 before completing the rugged surface on the lower electrode 130. After the lower electrode 130 having the rugged surface is completed in stage 4 of FIG. 7, the semiconductor substrate 100 is unloaded from the process chamber and cooled to room temperature.

Referring again to FIG. 6, a capacitor insulation film 132 is formed on the lower electrode 130 and a conductive material 134 is deposited on the capacitor insulation film to form an upper electrode.

According to the present invention as described above, a series of processes for forming the amorphous silicon thin layer on the surface of the lower electrode pattern, forming crystal nuclei and forming the rugged surface are successively performed in the process chamber without vacuum breakdown, thus enabling processing in a highly clean state. Accordingly, the drawbacks which may be encountered in the prior art, such as failure of growth of the crystal grains, can be overcome, and uniformity of crystal grain size and density can be increased.

Further, according to methods of the present invention, deposition of the amorphous layer between the lower electrode and the rugged surface decreases the ratio of the minimum value to the maximum value of capacitance (hereinafter, referred to as Cmin/Cmax). But, this problem can be solved without an additional heat treatment for an ideal Cmin/Cmax, since the semiconductor substrate is in effect subjected to heat treatment by process steps which occur subsequent to the formation of a capacitor.

EXAMPLE 1

The characteristics of a capacitor having a rugged surface on a lower electrode according to methods of the present invention are estimated as follows.

To estimate the effect of formation of an amorphous silicon thin layer on the subsequently formed rugged surface on a lower electrode pattern, a temperature stabilization time, that is, a standby time before supply of a process gas needed to form the amorphous silicon thin layer, was varied from between 30–180 seconds and a process gas supply time was varied from between 80–140 seconds. The other conditions include a heater temperature of 765° C., a crystal nuclei growth time of 180 seconds, and a constant process gas $Si_2H_6$ flow rate of 18 sccm. Then, the shape of crystal grains forming the rugged surface on the lower electrode was observed.

Figure 8A:
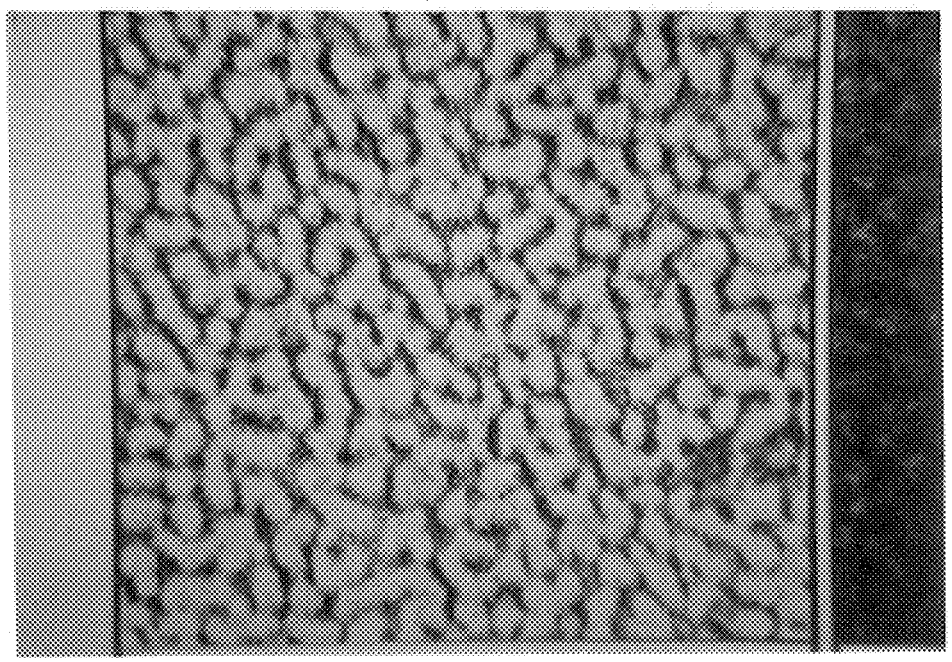
FIGS. 8A through 8D are SEM photos showing rugged surface structures obtained by varying the temperature stabilizing time and the process gas supply time.
Figure 8B:
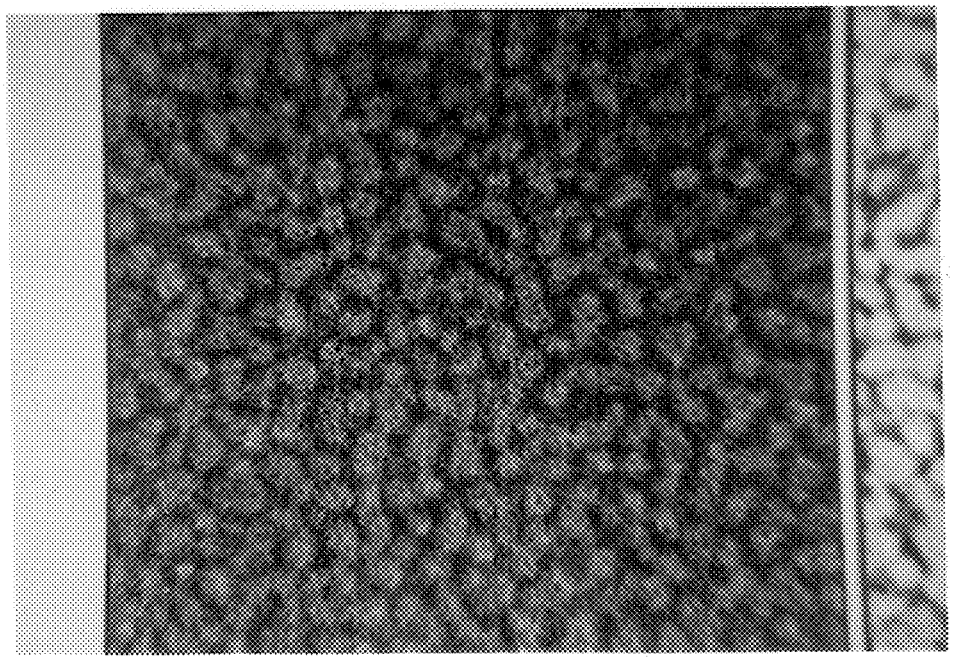
Figure 8C:
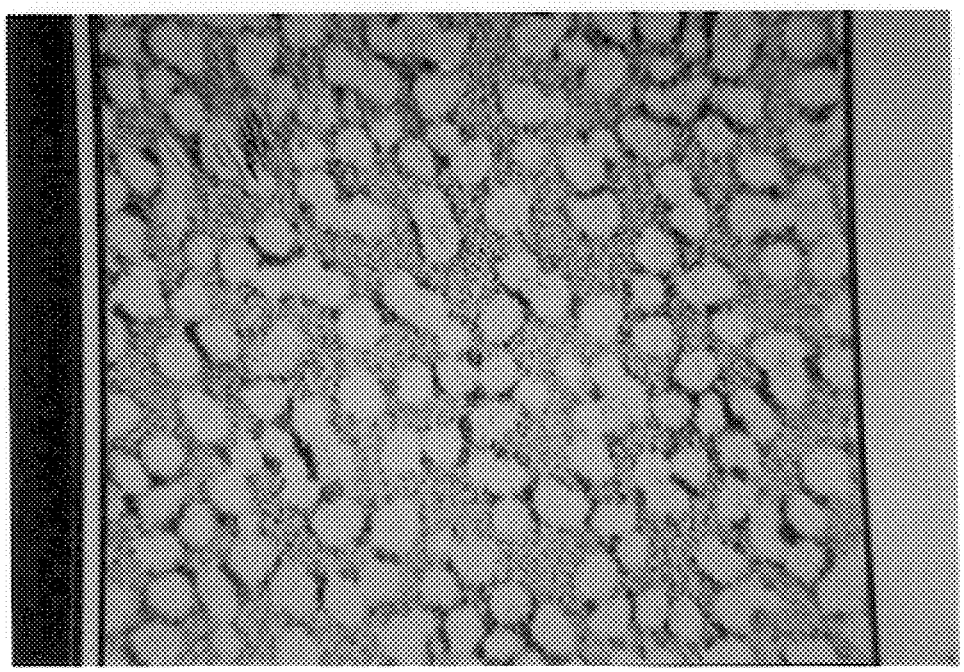
Figure 8D:
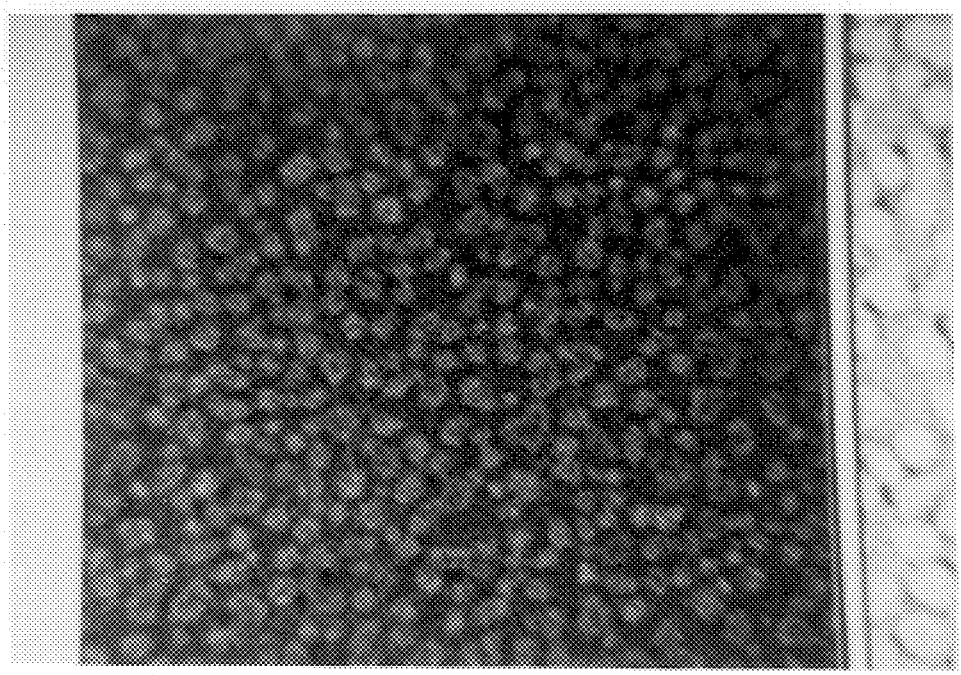

FIGS. 8A through 8D are SEM photos showing the structures of a rugged surface obtained under variations in temperature stabilization time and process gas supply time in the above test. FIG. 8A is for a temperature stabilization time of 180 seconds and a process gas supply time of 80 seconds, FIG. 8B for 90 seconds and 100 seconds, FIG. 8C for 60 seconds and 120 seconds, and FIG. 8D for 30 seconds and 140 seconds, respectively.

As noted from the results of FIGS. 8A through 8D, when crystal nucleation and growth are performed at a silicon crystallization temperature with a long enough temperature stabilization time after a temperature increase (FIG. 8A), the crystal grains are large and very dense. On the other hand, as the temperature stabilization time after the temperature increase is reduced to 90, 60, and 30 seconds, respectively, the amorphous film is deposited before the silicon crystallization temperature is reached after supply of the process gas even though the process gas supply time is increased, leading to a reduction of the time for forming crystal grains. As a result, the structure obtained after the process is completed exhibits low density and small size of crystal grains. Therefore, it is noted that the temperature stabilization time can change the effective area of the lower electrode, thus directly affecting a capacitance value, in fabricating a capacitor.

EXAMPLE 2

An insulation film and an upper electrode were formed on the samples formed under each condition of Example 1, and then capacitor characteristics were estimated.

Figure 9:
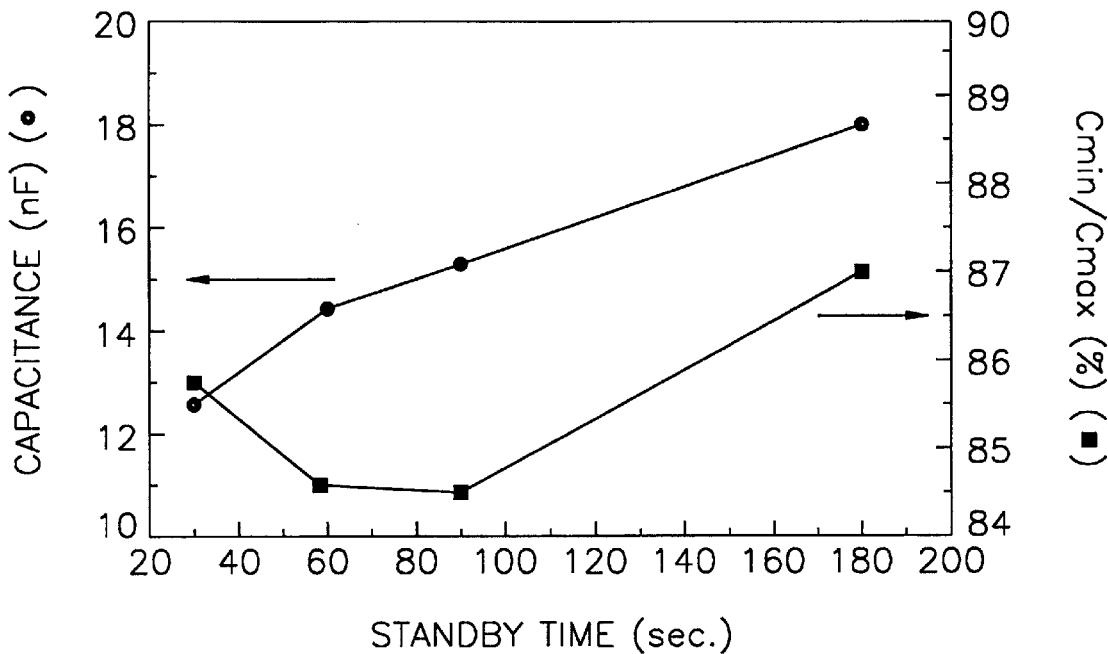
FIG. 9 is a graph showing the result from an estimate of capacitance and Cmin/Cmax characteristics of samples under each test condition.

FIG. 9 is a graph showing the result of an estimation of capacitance and Cmin/Cmax characteristics of each sample. Cmin/Cmax is the ratio of the minimum value to the maximum value of capacitance measured by varying a capacitance measuring voltage from −1.5 to +1.5V. Cmin is the capacitance obtained by grounding an n-type impurity-doped lower electrode and applying −1.5V to an upper electrode, while Cmax is the capacitance obtained by grounding the n-type impurity-doped lower electrode and applying +1.5V to the upper electrode.

It is noted from the result of FIG. 9 that the capacitance increases with an increase of the temperature stabilizing time due to an increase in the size and density of crystal grains formed on the surface of the lower electrode, as shown in the SEM photos of FIGS. 8A to 8D. The Cmin/Cmax was also observed to be distributed in the range of 84–87%.

EXAMPLE 3

Based on the estimation result of Example 2, a semiconductor substrate having an amorphous silicon lower electrode pattern formed thereon is loaded in a process chamber with a long enough temperature stabilization time. Then, characteristics of a capacitor provided with a lower electrode having a rugged surface according to methods of the present invention were estimated. The temperature stabilizing time was 180 seconds, the process gas supply time, i.e., the grain forming time, was 80 seconds, the process gas flow rate was 18sccm, and grain size, that is, grain height, was controlled by control of process temperature, in order to estimate capacitance and Cmin/Cmax characteristics according to grain size.

Figure 10:
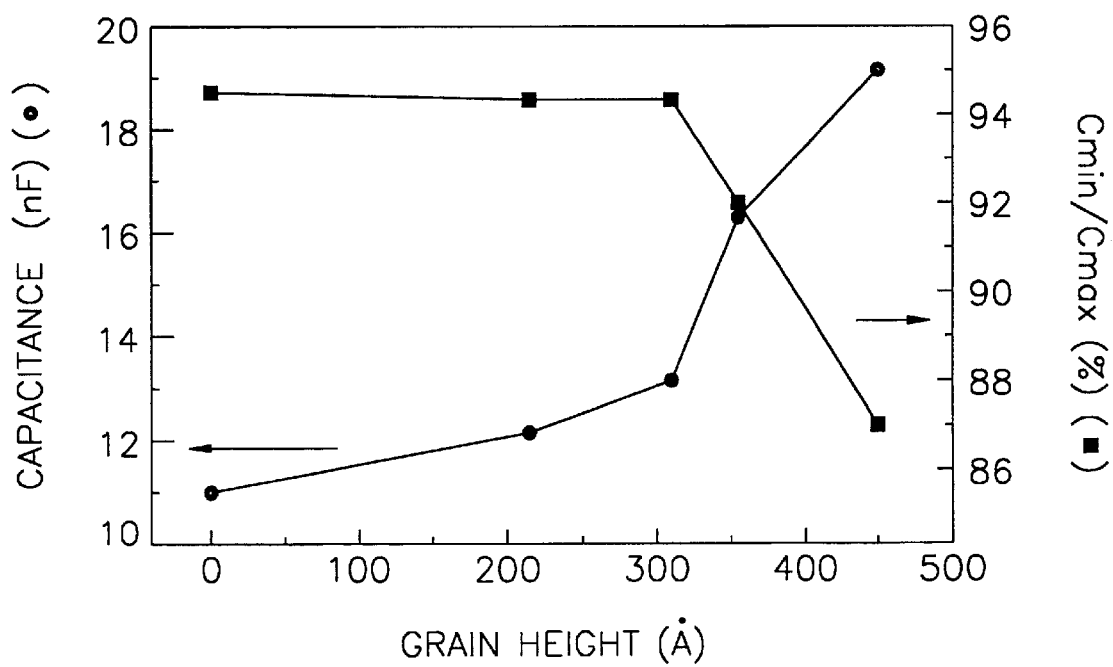
FIG. 10 is a graph showing the result from an estimate of capacitance and Cmin/Cmax characteristics with respect to the grain height with a long enough temperature stabilizing time given.

FIG. 10 is a graph showing capacitance and Cmin/Cmax characteristics as a result of the above estimation. In FIG. 10, grain height "0Å" indicates absence of crystal grains forming a rugged surface. From FIG. 10, it can be seen that the effective area and thus capacitance of the capacitor generally increases with an increase of grain size. Cmin/Cmax generally decreases as grain size increases.

As noted from the results, in the capacitor whose effective area is increased by using a rugged surface, capacitance increases and Cmin/Cmax decreases with an increase of grain size.

However, for a capacitor having a rugged surface formed with a short temperature stabilization time according to methods of the present invention, the reduction of grain size increases the capacitance, not Cmin/Cmax, in contrast to the sample of FIG. 10. The apparent reason is that when a silicon forming gas is supplied in high vacuum to form a rugged surface on an amorphous silicon lower electrode pattern doped with impurities, at a low substrate temperature, an amorphous silicon film not doped with impurities is formed before the formation of the rugged surface. Due to the amorphous silicon layer not doped with impurities, serious depletion may take place in the lower electrode, thus reducing the Cmin/Cmax value.

The problem of the Cmin/Cmax decrease caused by the amorphous silicon layer formed in high vacuum can be solved by a heat treatment after forming a capacitor. As described above, partial or entire absence of the rugged surface can be prevented and a desired capacitance can be obtained by properly controlling the temperature stabilizing time, process gas supply time, and other process parameters.

EXAMPLE 4

Figure 11:
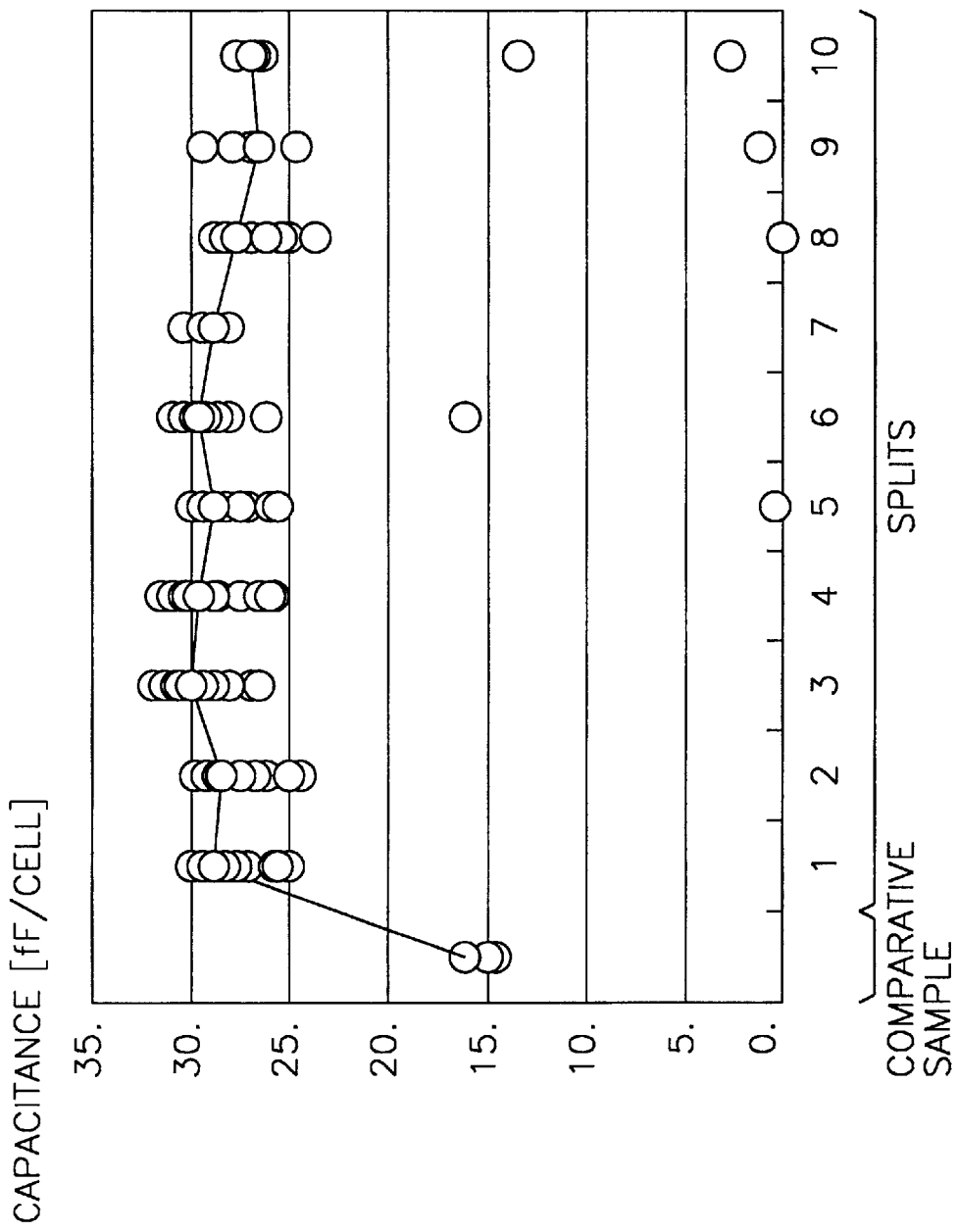
FIG. 11 is a graph showing the result from an estimate of capacitance characteristics of capacitors fabricated according to methods of the present invention.

FIG. 11 illustrates the result of an estimation of capacitance characteristics of a capacitor manufactured according to methods of the present invention. In FIG. 11, a comparative sample, to which methods of the present invention are not applied, has no rugged surface. As noted from the result of FIG. 11, a capacitance of about 25fF/cell of a capacitor manufactured according to methods of the present invention was increased by 1.6 times or more compared with the capacitance of about 15fF/cell of a capacitor to which methods of the present invention are not applied. Further, a reproducible and stable capacitance distribution was obtained according to an application frequency.

EXAMPLE 5

Figure 12:
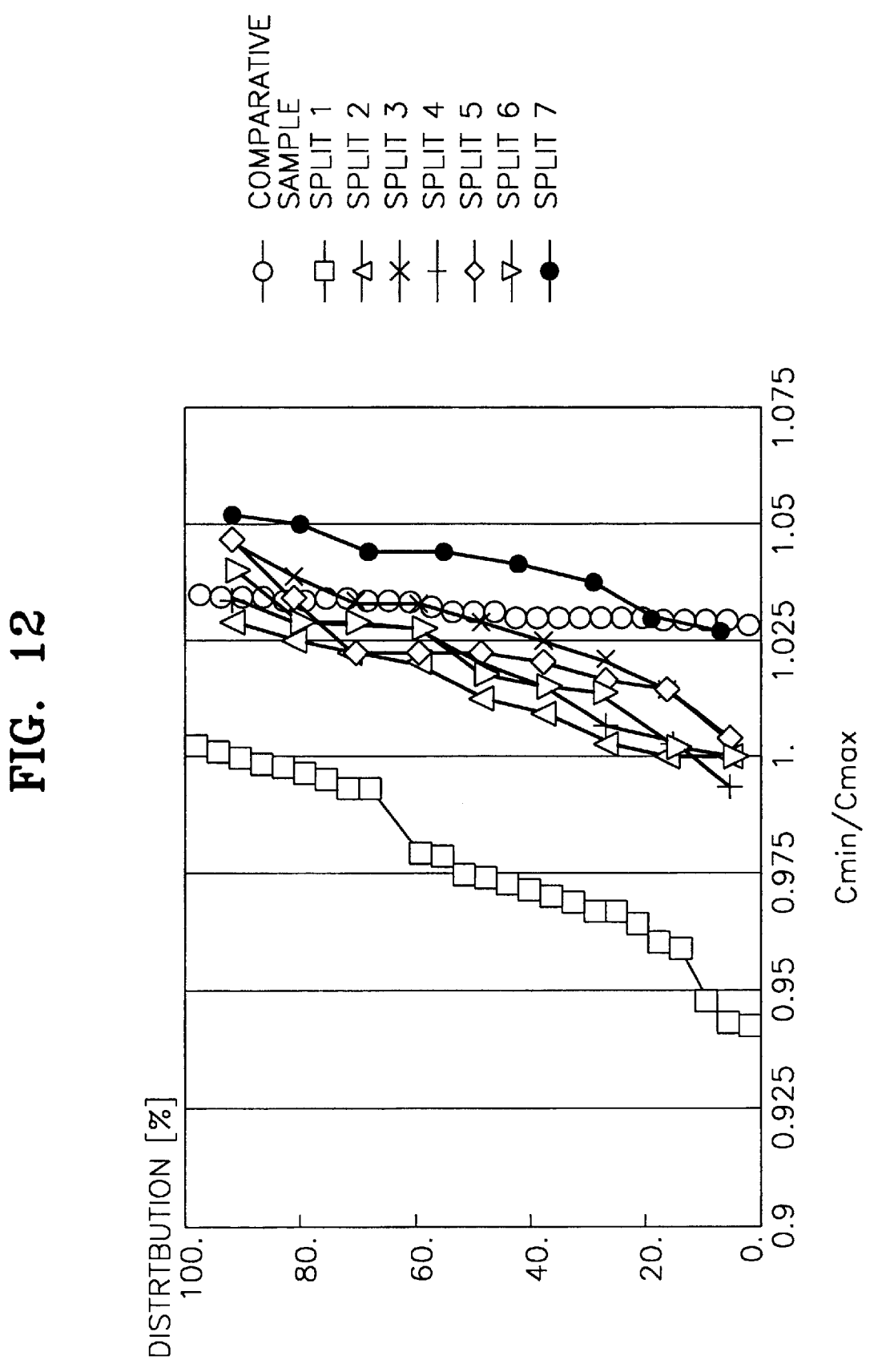

FIG. 12 illustrates the result of an estimation of Cmin/Cmax characteristics of a capacitor manufactured according to methods of the present invention. In FIG. 12, a comparative example, to which methods of the present invention are not applied, has no rugged surface formed therein. In a practical semiconductor device manufacturing process, a semiconductor substrate can be thermally treated without an additional heat treatment, since subsequent thermal processes generally occur thereafter. Thus, impurity diffusion into an amorphous silicon layer formed in high vacuum can be effected. Therefore, as noted from the result of FIG. 12, Cmin/Cmax characteristics are improved in capacitors manufactured according to the present invention.

As described above, according to the present invention, partial absence of crystal grains can be suppressed, and crystal size and density can be increased compared with conventional HSGs. Accordingly, the effective area of a capacitor in a semiconductor memory device can be efficiently increased.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A method of fabricating an electrode structure on a microelectronic substrate, comprising the steps of:

forming an amorphous silicon electrode on the microelectronic substrate;

cleaning the surface of the amorphous silicon electrode to remove contaminants and surface oxides therefrom;

forming a thin amorphous silicon layer having a smooth surface on the cleaned surface of the amorphous silicon electrode at temperature and process conditions that suppress formation of silicon crystal nuclei; and then forming and growing a plurality of silicon crystal nuclei on the smooth surface of the thin amorphous silicon layer opposite the amorphous silicon electrode.

2. A method according to claim 1 wherein the step of forming a thin amorphous silicon layer comprises the steps of:

loading the microelectronic substrate including the cleaned surface of the amorphous silicon electrode into a process chamber which is maintained under a high vacuum; and supplying a predetermined gas into the process chamber for a predetermined time.

3. A method according to claim 1 wherein the cleaning step comprises the step of wet cleaning the surface of the amorphous silicon electrode.

4. A method according to claim 2:

wherein the process chamber includes a susceptor therein;

wherein the loading step comprises the step of mounting the microelectronic substrate on the susceptor; and wherein the supplying step further comprises the step of heating the susceptor during the supplying step.

5. A method according to claim 4 wherein the heating step comprises the steps of:

maintaining the susceptor at temperatures between 700–1000° C. for 5–40 seconds; and immediately thereafter, maintaining the susceptor at temperatures between to 500–800° C.

6. A method according to claim 4 wherein the heating step comprises the step of maintaining the susceptor at a constant temperature.

7. A method according to claim 2 wherein the predetermined gas is at least one of $SiH_4$, $Si_2H_6$ and $SiH_2Cl_2$.

8. A method according to claim 1 wherein the step of forming a thin amorphous silicon layer on the cleaned surface of the amorphous silicon electrode and the step of forming and growing a plurality of silicon crystal nuclei on the thin amorphous layer are performed without breaking vacuum therebetween.

9. A method according to claim 2 wherein the high vacuum is pressure of $10^{-7}$ torr or less.

10. A method according to claim 1 wherein the step of forming and growing a plurality of silicon crystal nuclei on the thin amorphous layer comprises the steps of:

supplying a predetermined gas to form the plurality of silicon crystal nuclei on the thin amorphous layer; and terminating the supplying of the predetermined gas to grow the plurality of silicon crystal nuclei.

11. A method according to claim 1 wherein the forming and growing step is followed by the steps of:

forming a dielectric layer on the grown silicon crystal nuclei; and forming a second electrode on the dielectric layer, opposite the grown silicon crystal nuclei, to thereby fabricate a capacitor on a microelectronic substrate.

12. A method according to claim 1 wherein the step of forming an amorphous silicon electrode is preceded by the steps of:

forming a memory cell transistor in the microelectronic substrate, the transistor including a source/drain at a face of the microelectronic substrate; and forming an insulating layer on the microelectronic substrate, the insulating layer including a contact hole which exposes the source/drain; and wherein the step of forming an amorphous silicon electrode comprises the step of forming an amorphous silicon electrode on the insulating layer, and electrically contacting the source/drain through the contact hole, to thereby fabricate a dynamic random access memory.

13. A method according to claim 12 wherein the forming and growing step is followed by the steps of:

forming a dielectric layer on the grown silicon crystal nuclei; and forming a second electrode on the dielectric layer, opposite the grown silicon crystal nuclei, to thereby fabricate a capacitor on a microelectronic substrate.

14. A method according to claim 11 wherein the step of forming a thin amorphous silicon layer comprises the steps of:

loading the microelectronic substrate including the cleaned surface of the amorphous silicon electrode into a process chamber which is maintained under a high vacuum; and supplying a predetermined gas into the process chamber for a predetermined time.

15. A method according to claim 14:

wherein the process chamber includes a susceptor therein;

wherein the loading step comprises the step of mounting the microelectronic substrate on the susceptor; and wherein the supplying step further comprises the step of heating the susceptor during the supplying step.

16. A method according to claim 15 wherein the heating step comprises the steps of:

maintaining the susceptor at temperatures between 700–1000° C. for 5–40 seconds; and immediately thereafter, maintaining the susceptor at temperatures between to 500–800° C.

17. A method according to claim 11 wherein the step of forming a thin amorphous silicon layer on the cleaned surface of the amorphous silicon electrode and forming and growing a plurality of silicon crystal nuclei on the thin amorphous layer are performed without breaking vacuum therebetween.

18. A method according to claim 12 wherein the step of forming a thin amorphous silicon layer comprises the steps of:

loading the microelectronic substrate including the cleaned surface of the amorphous silicon electrode into a process chamber which is maintained under a high vacuum; and supplying a predetermined gas into the process chamber for a predetermined time.

19. A method according to claim 18:

wherein the process chamber includes a susceptor therein;

wherein the loading step comprises the step of mounting the microelectronic substrate on the susceptor; and wherein the supplying step further comprises the step of heating the susceptor during the supplying step.

20. A method according to claim 13 wherein the step of forming a thin amorphous silicon layer on the cleaned surface of the amorphous silicon electrode and forming and growing a plurality of silicon crystal nuclei on the thin amorphous layer are performed without breaking vacuum therebetween.

21. A method according to claim 1 wherein the step of forming a thin amorphous silicon layer comprises the step of forming a thin amorphous silicon layer having thickness of several tens of Ångstroms, on the cleaned surface of the amorphous silicon electrode.

22. A method of fabricating an electrode structure on a microelectronic substrate, comprising the steps of:

forming an amorphous silicon electrode on the microelectronic substrate;

cleaning the surface of the amorphous silicon electrode to remove contaminants and surface oxides therefrom;

loading the microelectronic substrate including the cleaned surface of the amorphous silicon electrode into a process chamber which is maintained under a high vacuum;

supplying a predetermined gas into the process chamber to form a thin amorphous silicon layer having a smooth surface on the cleaned surface of the amorphous silicon electrode while increasing the temperature of the microelectronic substrate to a temperature lower than that which forms silicon crystal nuclei; then supplying the predetermined gas into the process chamber to form a plurality of silicon crystal nuclei on the smooth surface of the thin amorphous silicon layer at temperature that forms the silicon crystal nuclei; and then growing a plurality of hemispherical grains from the silicon crystal nuclei at constant temperature.

23. A method according to claim 22 wherein the cleaning step comprises the step of wet cleaning the surface of the amorphous silicon electrode.

24. A method according to claim 22 wherein the predetermined gas is at least one of $SiH_4$, $Si_4H_6$ and $SiH_2Cl_2$.

25. A method according to claim 22 wherein the step of growing a plurality of hemispherical grains comprises the step of terminating the step of supplying of the predetermined gas.

26. A method according to claim 22 wherein the growing step is followed by the steps of:

forming a dielectric layer on the hemispherical grains; and forming a second electrode on the dielectric layer, opposite the hemispherical grains, to thereby fabricate a capacitor on a microelectronic substrate.

27. A method according to claim 22 wherein the step of forming an amorphous silicon electrode is preceded by the steps of:

forming a memory cell transistor in the microelectronic substrate, the transistor including a source/drain at a face of the microelectronic substrate; and wherein the step of forming an amorphous silicon electrode comprises the step of forming an amorphous silicon electrode on the insulating layer, and electrically contacting the source/drain through the contact hole, to thereby fabricate a dynamic random access memory.

28. A method according to claim 27 wherein the growing step is followed by the steps of:

forming a dielectric layer on the hemispherical grains; and forming a second electrode on the dielectric layer, opposite the hemispherical grains, to thereby fabricate a capacitor on a microelectronic substrate.

* * * * *